United States Patent [19]
Rao

[11] Patent Number: 5,920,885
[45] Date of Patent: Jul. 6, 1999

[54] DYNAMIC RANDOM ACCESS MEMORY WITH A NORMAL PRECHARGE MODE AND A PRIORITY PRECHARGE MODE

[75] Inventor: G. R. Mohan Rao, Dallas, Tex.

[73] Assignee: Cirrus Logic, Inc., Fremont, Calif.

[21] Appl. No.: 09/088,535

[22] Filed: Jun. 1, 1998

Related U.S. Application Data

[62] Division of application No. 08/641,887, May 2, 1996.
[51] Int. Cl.⁶ .............................. G06F 12/00; G11C 7/00
[52] U.S. Cl. ..................... 711/105; 711/158; 711/169; 365/193; 365/203
[58] Field of Search ..................... 711/105, 169, 711/158; 365/193, 203

[56] References Cited

U.S. PATENT DOCUMENTS

| 5,555,526 | 9/1996 | Kim ........................................ 365/233 |
| 5,600,605 | 2/1997 | Schaefer ................................ 365/233 |
| 5,623,453 | 4/1997 | Shinozaki .............................. 365/233 |

*Primary Examiner*—Reginald G. Bragdon
*Attorney, Agent, or Firm*—James J. Murphy; Steven A. Shaw

[57] ABSTRACT

A dynamic random access memory (DRAM) includes priority access control circuitry, where the DRAM has a first precharge mode and a priority precharge mode. In the first precharge mode, the array is precharged during an external row address strobe (RAS) and accessed during an active state of the external RAS. In the priority precharge mode, the array is precharged during a precharge state of an internal RAS initiated by a priority signal received during any one of the precharge and active states of the external RAS, where the priority access control circuitry returns to the first mode on a subsequent precharge state of the external RAS.

7 Claims, 7 Drawing Sheets

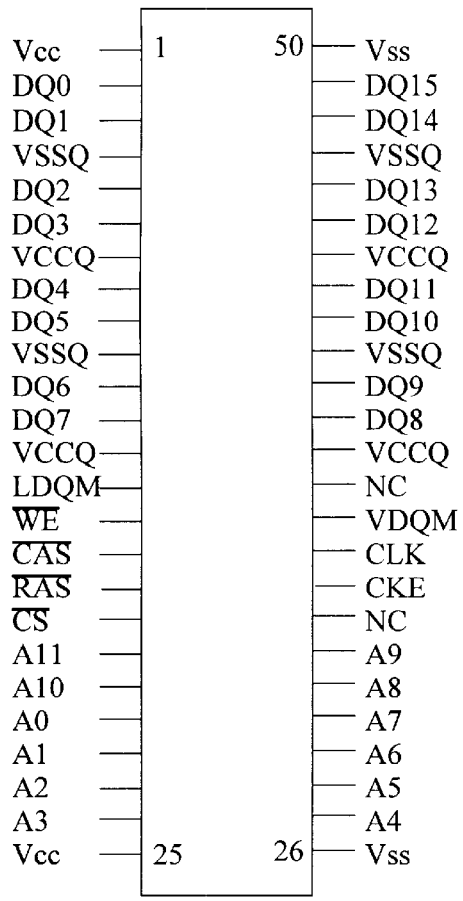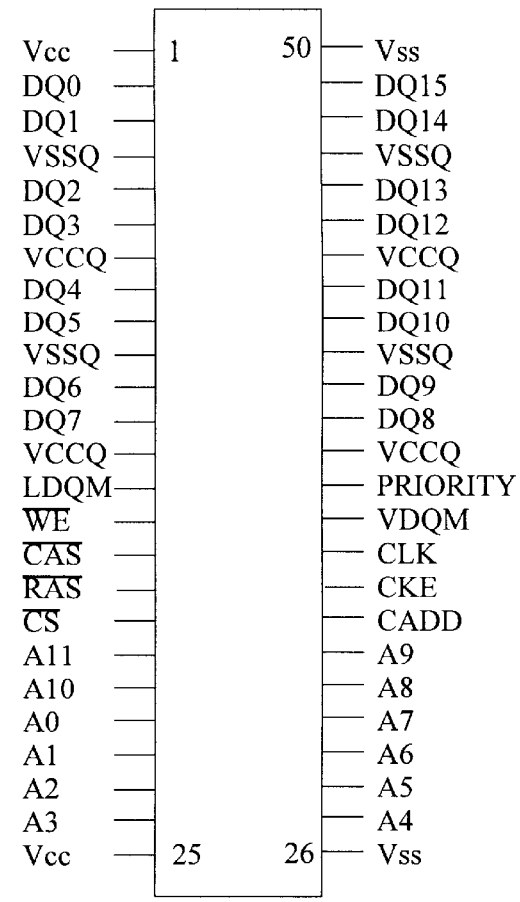
Fig. 6A
(Prior Art)
Fig. 6B

DYNAMIC RANDOM ACCESS MEMORY WITH A NORMAL PRECHARGE MODE AND A PRIORITY PRECHARGE MODE

This is a division of application Ser. No. 08/641,887 filed May 2, 1996 entitled "MEMORIES WITH PIPELINED ADDRESSING AND PRIORITY ACKNOWLEDGING AND SYSTEMS AND METHODS USING THE SAME."

TECHNICAL FIELD OF THE INVENTION

The present invention relates in general to electronic memories and in particular to memories with pipelined addressing and priority acknowledging and systems and methods using the same.

BACKGROUND OF THE INVENTION

A typical processing system with video/graphics display capability includes a central processing unit (CPU), a display controller coupled to the CPU by a CPU local bus (directly and/or through core logic), a system memory coupled to the CPU local bus through core logic, a frame buffer memory coupled to the display controller via a peripheral local bus (e.g., PCI bus), peripheral circuitry (e.g., clock drivers and signal converters, display driver circuitry), and a display unit. The CPU is the system master and generally provides overall system control in conjunction with the software operating system. Among other things, the CPU communicates with the system memory, holding instructions and data necessary for program execution, normally through core logic. Typically, the core logic is two to seven chips, with one or more chips being "address intensive" and one or more other chips being "data path intensive." The CPU also, in response to user commands and program instructions, controls the contents of the graphics images to be displayed on the display unit by the display controller.

The system and display frame buffer memories are typically constructed from dynamic random access memory devices (DRAMs) since DRAMs are typically less expensive, consume substantially less power, and provide more bits per given chip space (i.e. have a higher density). DRAMs however are substantially slower than other types of memories, in particular static random access memories (SRAMs). As a result, the system memory and frame buffer bandwidths are normally limited.

To account for limited system and/or frame buffer memory bandwidth, one or more levels of data cache memory may be provided. The level 1 (L1) data cache is normally on the CPU memory chip itself. When used, the level 2 (L2) and level 3 (L1) are normally off-chip and coupled to the CPU by the CPU local bus. Cache memories are typically constructed from SRAMs which provide shorter access time and higher bandwidth, although they consume more power, are more expensive to fabricate, and provide fewer cells (bits) per given chip space. For example, a typical SRAM cache may have a cycle time of 3 to 10 nsecs for a random access while a random cycle time of a typical DRAM memory device may require 110 to 130 nsecs. In other words, the "latency" for a typical DRAM is approximately 10 times that of the typical SRAM.

During cache operations, blocks of data are read from the system memory and written into the cache in anticipation of the data needs of the CPU. This "encachement" is typically done by the operating system as a function such factors as the spatial and/or temporal locality of the data required by the CPU during a sequence of operations. If the CPU requires data for a given operation, and that data is already part of the encached block (i.e a "cache hit" occurs), it can be accessed much faster than from the slower system memory. By selecting latency and density ratios between the system memory and the cache memory to be on the order of 10 to 1, and depending on the partitioning of the system memory by the operating system, cache hits for reads to memory by the CPU can exceed 95%. When required data is not found encached, a cache "miss" occurs, and the CPU must directly access the system memory.

Even with cache hit rates of 95%, state of the art processors running at high clock rates are still confronted with a substantial number of cache misses. Thus, significant number of direct accesses to the lower bandwidth system memory cannot be avoided. The problem is further compounded in "clock doubling" and "clock tripling" CPUs. In sum, state of the art CPUs simply require more bandwidth than can be accommodated by presently available memory devices and architectures, including those implementing one or more cache memories.

In addition to memory bandwidth considerations, other access requirements must be considered for each memory subsystem. For example, accesses to the system memory are normally made in either bursts or long streams of data. Typically, the bus is only seized for a short period of time, and then run at peak speed. The display frame buffer memory on the other hand is accessed on an almost continuous basis, since 70% of the time the frame buffer is supporting display screen refresh. In a Unified Memory Architecture (UMA), the unified memory maintains both the system memory and the display frame buffer and therefore the frame buffer and system memory requirements must be balanced.

Further, the CPU and the peripheral controllers may demand that the memory subsystems support priority operations. During priority operations, the CPU or processor may request that a given memory operation be performed before another to meet some processing goal. For example, the CPU may request a read operation before a write operation, even though the write operation is currently earlier in the instruction queue, because the CPU requires data to complete the current processing operation. As another example, if a write operation and a read operation are time queued, and since a read operation typically takes longer, the write may be executed first.

Thus, the need has arisen for circuits, systems, and methods for constructing and operating memory devices and subsystems. Such circuits, systems and methods should be applicable to the design and construction of devices and subsystems for use in state of the art processing systems, but not necessarily limited thereto. Among the particular considerations to be addressed should be memory latency, priority and access type. circuitry. The precharge circuitry in a first mode precharges the array in response to a row address strobe received from an external source and in a priority mode in response to an internally generated row address strobe.

The principles of the present invention are also embodied in methods of operating memories. In one such method, an array of dynamic random access memory cells operates in precharge and active cycles. In a first mode, the precharge and active cycles are timed with an externally generated row address. In a priority mode, the precharge and active cycles are timed with an internally generated row address strobe.

Memories embodying the principles of the systems and methods using the same have substantial advantages over the prior art. Among other things, the principles of the present invention allow for a substantial reduction in a latency. Further, these principles allow for data to be provided to the system core logic and/or the CPU in the bursts and streams, which preferably optimize CPU performance. Finally, the principles of the present invention allow for a non-priority operation to substantially immediately be implemented, even if a memory operation is already taking place.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6A and 6B are respectively a top plan view of a typical prior art DRAM in a selected package and a top plan view of a memory according to the principles of the present invention in a similar package.

DETAILED DESCRIPTION OF THE INVENTION

The principles of the present invention and their advantages are best understood by referring to the illustrated embodiment depicted in FIGS. 1–4 of the drawings, in which like numbers designate like parts. While memory devices embodying the principles of the present invention are useful in a wide number of applications, for purposes of illustration, such memory devices will be described in conjunction with a basic computer information processing system architecture (PC) typically employed in personal computers.

Figure 1A:
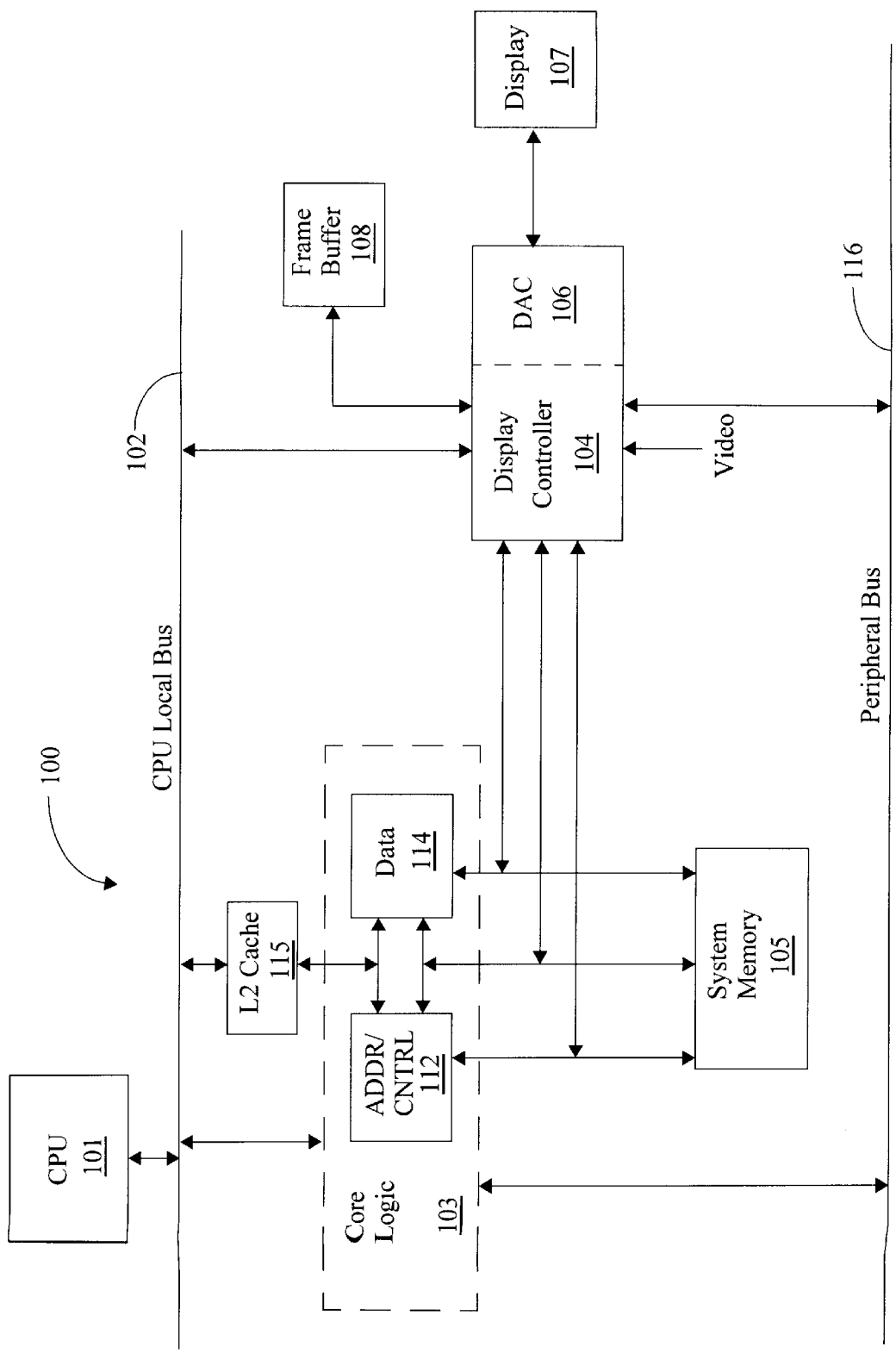
FIGS. 1A and 1B are high level function block diagrams of an exemplary information processing system (PC) in which the principles of the present invention are suitably applied.

FIG. 1A is a high level functional block diagram of the portion of a processing system 100. System 100 includes a central processing unit 101, a CPU local bus 102, core logic 103, a display controller 104, a system memory 105, a digital to analog converter (DAC) 106, frame buffer 108 and a display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium™ class microprocessor or the like, used in commercial personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address and system controller intensive" while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; may abort operations if their cycles are incomplete; and arbitrates for the data path of bus 102.

CPU 101 can directly communicate with core logic 103 or through an external (L2) cache 115. L2 cache 115 may be for example a 256 KByte fast SRAM device(s). It should be noted that CPU 101 can also include on-board (L1) cache, typically up to 16 kilobytes.

Display controller 104 may be any one of a number of commercially available VGA display controllers. For example, display controller 104 may be one of the Cirrus Logic CL-GD754x series of display controllers. The structure and operation of such controllers is described in CL-GD754x *Application Book*, Rev 1.0, Nov. 22, 1994, and CL-GD7542 LCD VGA *Controller Preliminary Data Book*, Rev. 1.0.2, June 1994, both available from Cirrus Logic, Inc., Fremont, Calif., and incorporated herein by reference. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus which may be for example a PCI local bus. Generally, display controller 104 controls screen refresh, executes a limited number of graphics functions such as line draws, polygon fills, color space conversion, display data interpolation and zooming, and video streaming and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive display 107 in response. In the illustrated embodiment, DAC 106 is integrated with display controller 104 onto a single chip. Depending on the specific implementation of system 100, DAC 106 may also include a color palette, YUV to RGB format conversion circuitry, and/or X- and Y- zooming circuitry, to name a few options. Display 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

The data paths in system 100 will vary with each design. For example, system 100 may be a "64-bit" or "72-bit"

system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select, error detection correction, and virtual memory operations. In a typical CPU processor system today, the address portions of CPU bus 102 and PCI bus 116 are typically on the order of 30 bits wide.

Figure 1B:
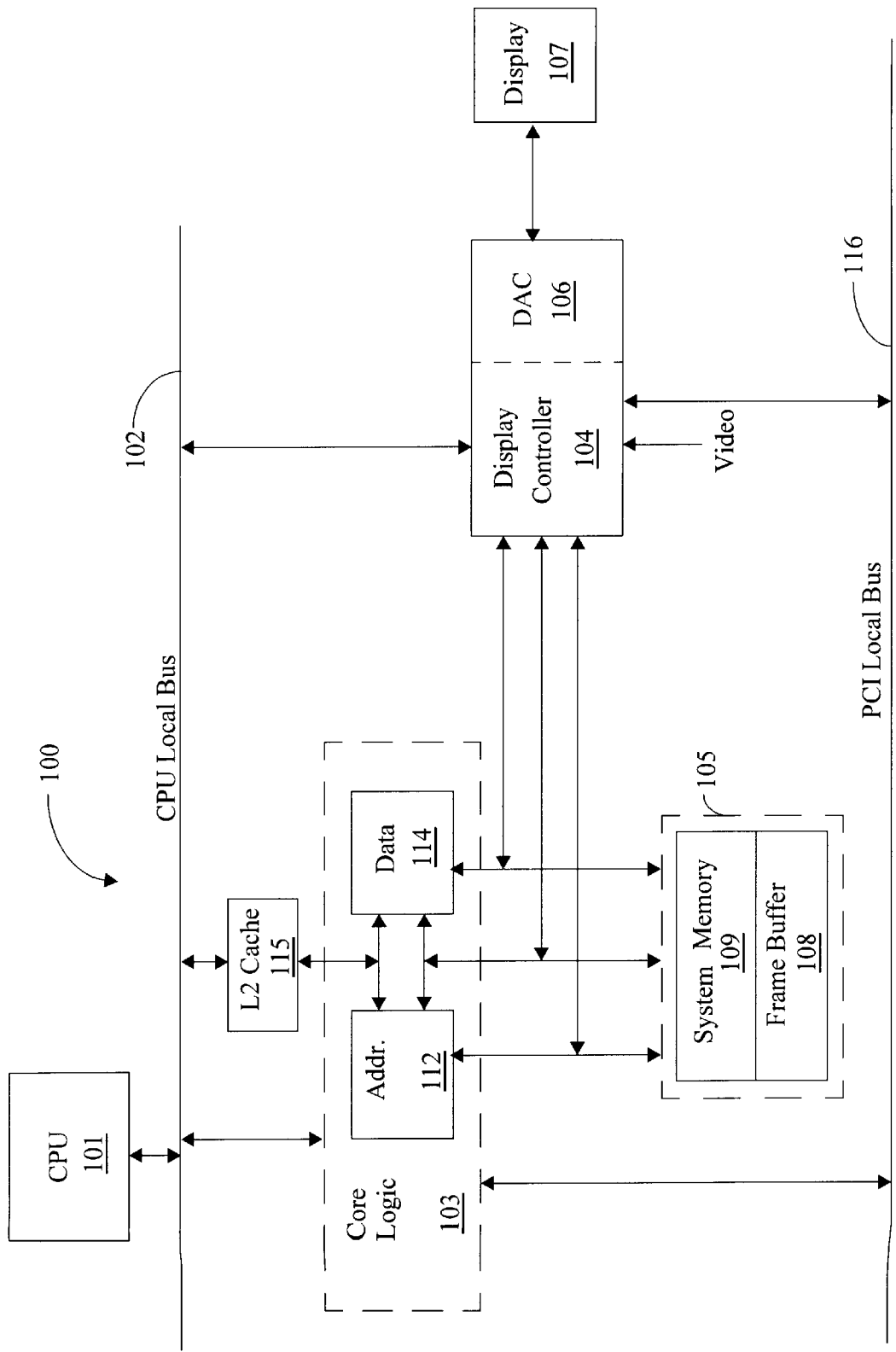

FIG. 1B is an alternate system architecture to which the principles of the present invention may advantageously be applied. In this example, memory 105 is a "unified" memory system since the system memory 109 and frame buffer 108 are collocated in a single integrated circuit or bank of integrated circuits. This is in contrast to those systems in which the frame buffer is separate and apart from the system memory and interfaces with the remainder of the system through the display controller. System memory 109 again is preferably a traditional system memory which stores data, addresses, and instructions under the command of CPU 101 as required for executing various processing functions and applications programs. As in traditional systems, the frame buffer 108 stores the pixel data required to generate the required images on the screen of display unit 107.

Figure 2:
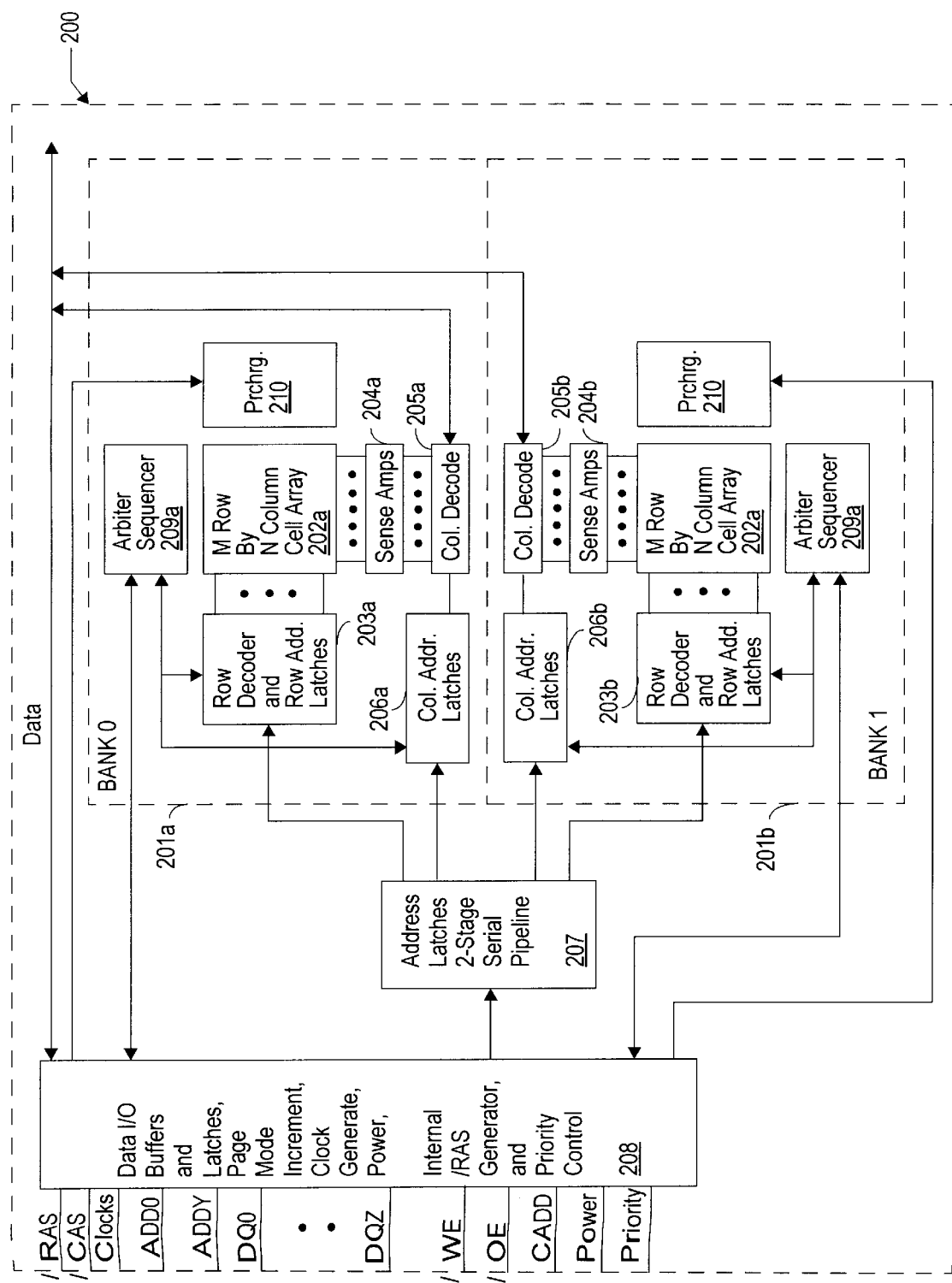
FIG. 2 is a functional block of a memory subsystem embodying the principles of the present invention.

FIG. 2 is a high level functional block diagram of a memory subsystem (device) 200 embodying the principles of the present invention. Memory 200 may be used for example in the construction of either system memory 105 and/or display frame buffer 108 in the system of FIG. 1A or the unified memory 105 of FIG. 1B, to name a few examples. In the preferred embodiment, memory subsystem 200 is fabricated as a single integrated device (chip), although the present inventive principles are not limited to single chip embodiments.

Memory 200 in the illustrated embodiment includes a pair of banks 201a (BANK 0) and 201b (BANK 1) for exemplary purposes. The principles of the present invention may however be applied to multiple bank memories having a greater number of banks 201.

Each bank 201 includes an array 202 of memory cells arranged in M Rows and N Columns. In the preferred embodiment, the cells of arrays 201 are dynamic random access memory (DRAM) cells, although these cells could also be static random access memory (SRAM) or other types of volatile memory cells, as well as non-volatile memory cells, in alternate embodiments.

Each row is controlled by a conductive wordline. For purposes of discussion, "column" will be interpreted as one or more physical columns accessed by a single column address. In other words, if memory 200 is a "by 16" device wherein a 16-bit word along a selected row is accessed per column address, each "column" includes 16 physical columns of cells. Each physical column of cells includes a pair of half-bitlines organized in either an open or a folded bitline architecture.

The wordlines of the array 202 of each bank 201 are controlled by a row decoder and row decoder latches 203. Access to the bitlines of each array 201 is controlled by a corresponding set of sense amplifiers 205 and a column decoder 205. The word width of each access through each column decoder 205 per column address will vary from embodiment to embodiment. For example, memory 200 may be a by 1, by 2, by 4, by 8, by 16, by 32, by 64, or larger word-width device.

Each bank 201 also includes a set of column address latches 206 which present column addresses to the corresponding column decoder 205 during address pipelining according to the present invention.

In the preferred embodiment, row decoders—latches 203, sense amplifiers 204, column decoders 205, and column address latches 206 are dynamic circuitry known in the art. Typical dynamic decoding and sensing circuitry are illustrated in "A 5-volt Only 64 k DRAM", L. S. White, N. H. Hong, D. J. Redwine, and G. R. Mohan Rao, International Solid State Circuit Conference 1980, Digest of Technical Papers, pp. 230–231, incorporated herein by reference.

Some of the fundamental principles of DRAM construction and operation are additionally described in.: "A 64-k Dynamic RAM Needs Only One 5-volt Supply to Outstrip 16 k Parts", G. R. Mohan Rao and John Hewkin, Electronics, Sep. 28, 1978, pp. 109–116; "A 1 Mb DRAM With Design-For-Test Functions," J. Neal, B. Holland, S. Inoue, W. K. Loh, H. McAdams and K. Poteet, International Solid State Circuit Conference 1986, Digest of Technical Papers, pp. 264–265; "A 4 Mb DRAM With Half Internal-Voltage Bit-line Precharge", International Solid State Circuit Conference 1986, Digest of Technical Papers, pp. 270–271; "A Full Bit Prefetch Architecture For Synchronous DRAMs", T. Sunaga, K. Hosokawa, Y. Nakamura, M. Ichinose, A Moriwaki, S. Kakimi and N. Kato, IEEE Journal of Solid State Circuits, Vol 30., No. 9, September 1995, pp. 994–1005; and "DRAM Macros For ASIC Chips", IEEE Journal of Solid State Circuits, Vol 30., No. 9, September 1995, pp. 1006–1014, each incorporated herein by reference.

According to the principles of the present invention, memory 200 includes a set of address latches 207. In the illustrated embodiment, latches 207 operate as 2-stage serial address pipeline, although in alternate embodiments the number of stages may vary depending on such factors as the number of addresses being pipelined and the required timing relationship. Pipelined addresses are received from I/O and control circuitry 208 and output to the row decoder—latches 203 and column address latches 206 of banks 201 in a preselected sequence. Preferred address pipelining techniques are discussed in detail below.

Input/output and control circuitry 208 includes conventional data I/O buffers and latches, clock generation circuitry and power distribution. In the preferred embodiment, addresses are received at address inputs ADD 0-ADD_Y from a multiplexed address bus in response to a row address strobe (/RAS) and a column address strobe (/CAS). Data is input through data pins DQ 0-DQ Z in response to an active write enable signals $\overline{WE}$ and data is output through data input/outputs DQ0-DQZ in response to an output enable signal $\overline{OE}$.

Each bank 201 additionally includes arbiter-sequencer circuitry 209. The arbiter portion of circuitry 209 controls the priority request discussed below. Generally, each arbiter is programmed, either through software, registers or hard-wired circuitry, to control the latching of addresses into the corresponding row and column latches 203/206. Addresses are essentially steered through selective control of the row and column latches 203/206. Arbiter circuitry 209 also controls data flow between the corresponding banks 201 and the input/output buffers and latches in circuitry 208. The sequencer portion of circuitry 209 provides for column address incrementation for burst accesses along a selected row in the corresponding array 201.

The operation of the preferred embodiment of the principles of the present invention can now be described in conjunction with the timing diagrams of FIGS. 3 and 4. For purposed of discussion, it will be assumed that memory 200 is a synchronous DRAM operating in response to a master clock CLK and the conventional DRAM control signals /RAS, /CAS, /OE and /WE. Memory 200 further operates in response to an address clock CADD, which in the illustrated embodiment is generated by core logic 103, although alternatively, CADD could be generated within CPU 101 or by a memory controller. It should be noted that the present invention may also be applied to asynchronous devices.

During the period when /RAS is high, memory 200 is in precharge. During precharge, the nodes of various dynamic circuits, such as those used in the column and row decoders, are pulled to a predetermined voltage. The bitlines of the cell arrays 201 voltage are equalized. In the preferred embodiment., at least some addresses are presented to memory 200 and latched during precharge periods such that when memory 200 enters the active cycle, i.e., when /RAS transitions low, those addresses are available and at least the row addresses may start to be decoded. This is in contrast to prior art DRAMs in which all the row and column addresses are input only after /RAS has transitioned low and the active period has been entered. In other words, address input during precharge reduces latency, the time between assertion of the row and column addresses and the first access along the addressed row.

Figure 3:
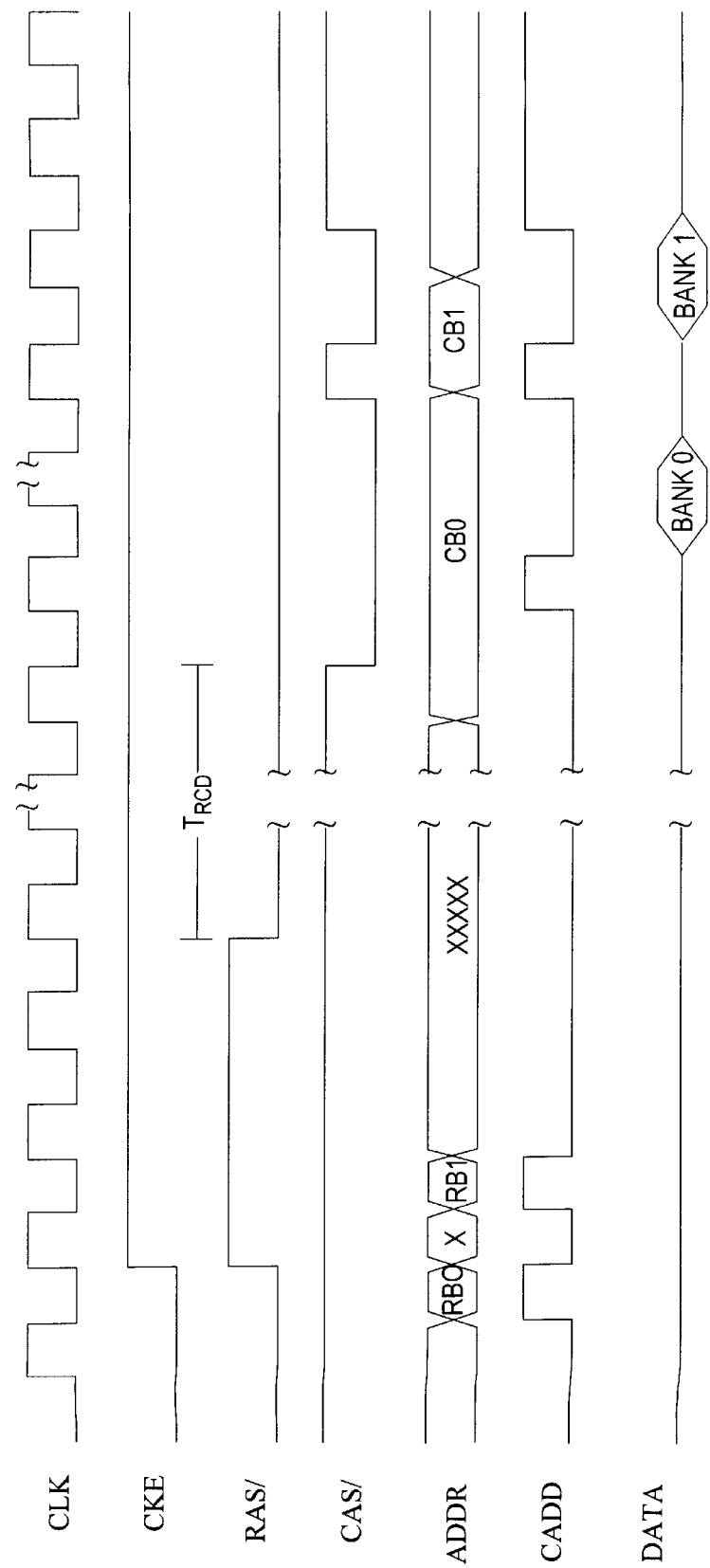
FIG. 3 is a conceptual timing diagram illustrating a first preferred operation of the memory depicted in FIG. 2.

In the embodiment of FIG. 3, which assumes a two bank configuration, the row addresses for Bank 0 and Bank 1 are clocked-in serially using clocks triggered by the address clock CADD during precharge. In the illustrated two bank embodiment, row addresses RB0 and RB1 are pipelined serially through two-stage pipelined address latches 207 latched into row decoder—row address latches 203 of Banks 0 and 1 respectively under control of arbiter-sequencer circuitry 209. In the preferred embodiment, the row addresses start being decoded as soon as /RAS transitions low.

After minimum required delay from the high to low transition of /RAS (i.e. $T_{RCD}$, the time for the RAS-CAS distance), /CAS transitions low. A column address to Bank 0 CB0 is clocked in with clocks triggered by CADD. /CAS triggers the clocks which pipeline data through the column decoders and enables the sense amplifiers. After a short delay, the data access to the addressed row and column in Bank 0 can be made.

In the operations depicted in FIG. 3, a second /CAS clock is presented to trigger the clocks necessary to pipeline data through column decoder 205 and enable sense amplifiers 204b of Bank 1. A column address to Bank 1 is latched in with clocks triggered by CADD and after a short delay the access to the addressed row and column in Bank 1 is made.

It should be noted that while FIG. 3 depicts a random access to each bank 201, page or burst accesses may also be implemented. During page or burst accessing, additional column addresses are used to access additional locations along the selected row of at least one of the banks 201. The additional column addresses may be clocked in from an external source using CADD or internally generated in the sequencer 209 of the bank being accessed. Access timing is preferably controlled for each page/burst with /CAS as discussed above for the random access. Arbiter circuitry 209 controls data input/output and column address steering to avoid contention between the banks. In other words, during page/burst accesses, the arbiter circuitry insures that only one bank is accessed at a time. Page and burst accessing is described in further detail in conjunction with FIG. 4.

Figure 4:
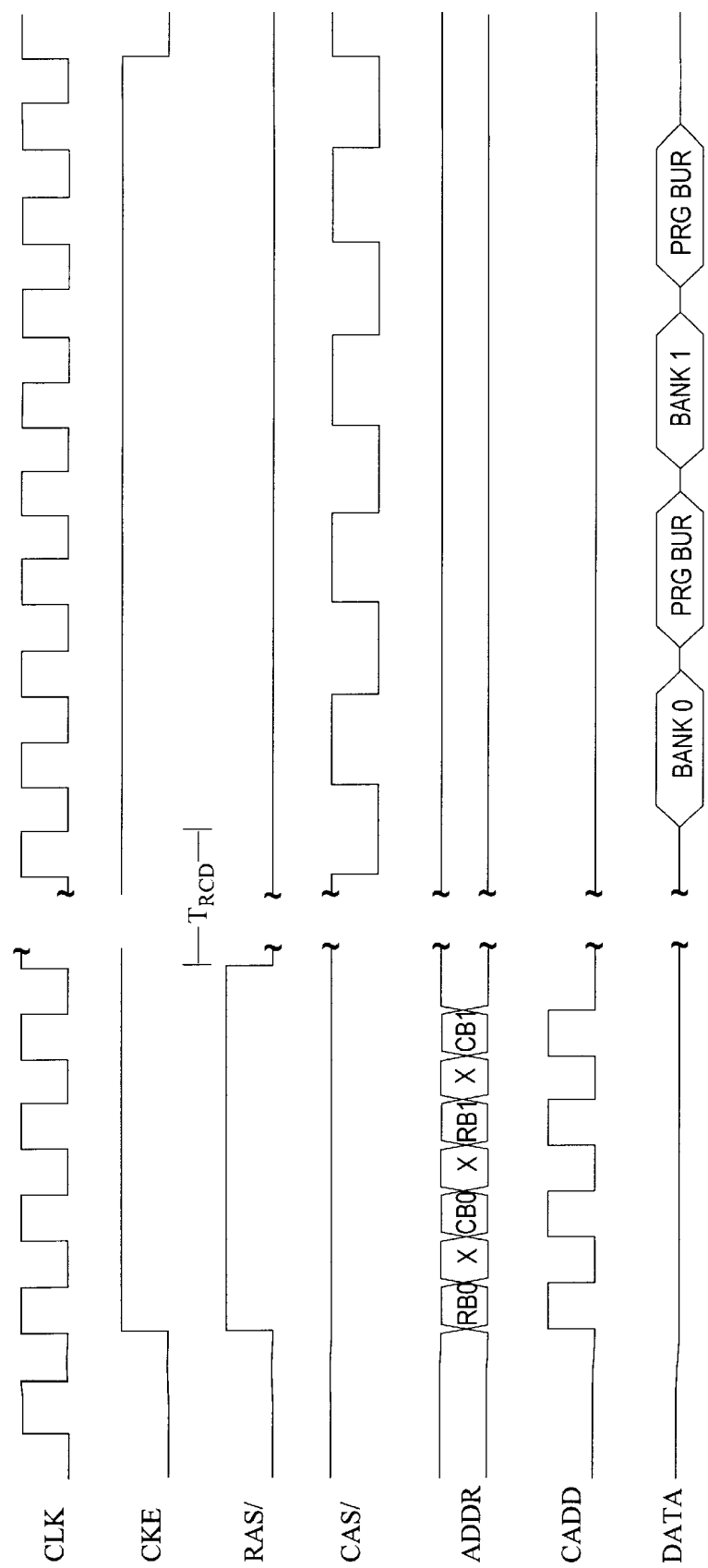
FIG. 4 is a conceptual timing diagram illustrating a second preferred operation of the memory illustrated in FIG. 2.

FIG. 4 is a conceptual timing diagram of an alternate method of operating memory 200. In this method, both the row and column addresses are clocked in with CADD and pipelined and latched with clocks triggered by CADD, for at least the random accesses, during the precharge period when /RAS is high. In the preferred embodiment, the row and column addresses. (RB0 and CB0)for BANK 0 are input first followed by the input of the row and column addresses (RB1 and CB1) for Bank 1. In alternate embodiments, the ordering of the addresses may change, as address ordering can be varied as a function of the core logic 103 and the steering by arbiter circuitry 209. The CPU is still the "master" as stated earlier, and it can decide (always) direct access to any memory, if it so chooses.

After the addresses are pipelined through pipelined address latches 207 and latched into the corresponding row and column address latches 203 and 206, accesses are controlled by /CAS. As discussed above, /CAS control the enablement of the sense amplifiers 204 and the pipelining of data through the column decoders 205.

In the illustrated embodiment, after the minimal required delay between the falling edge of /RAS and the first falling edge of /CAS, a random access is made to the addressed location in BANK 0, as previously discussed. In the timing diagram of FIG. 4 a programmed burst is also made from the selected row of Bank 0 following the random access. In particular, at least one additional column address is generated in the sequencer of circuitry 209a. With each internally generated column address, /CAS is cycled to time access to the addressed location through the corresponding sense amplifiers 204a and column decoder 205a. In FIG. 4, only a single burst and the corresponding /CAS cycle are shown for brevity and clarity; the actual number of locations accessed will vary depending on the programmed burst length. In FIG. 4, following the burst/page access to Bank 0, a random access and a burst access are made to Bank 1 in a similar fashion.

In the preferred embodiment, the arbiter-sequencer circuitry 209 of each bank 209 is programmed to control the burst accesses. In particular, the sequencer is programmed, either in hardware or in software (e.g. registers) to sequence from the input column address to provide the addresses required for a burst of accesses of a selected length. The arbiter circuitry is preferably programmed to insure that the data input/output circuitry of block 208 allows access only to one bank at a time. As with the ordering of the addresses being pipelined, it should be noted that the order of accesses shown in FIG. 4 is exemplary only. For example, Bank 1 could be accessed before Bank 0 or the random accesses to both of the banks could be performed before the burst accesses. Further, only one bank 201 may be accessed or a burst access performed to only one of the banks 201 alone. Any one of a number of combinations of accesses may be performed depending on the overall data needs of the system. This particular advantage is preferably implemented through latch control and column address generation by arbiter-sequencer circuitry 209.

According to further principles of the present invention, memory 200 will allow the associated CPU and/or core logic to perform a priority access, notwithstanding any accesses which are currently being performed by memory 200. To implement priority accessing, memory 200 is provided with an input for receiving a priority access initiation signal PRIORITY and an internal /RAS generator, preferably disposed within I/O and Control circuitry 208.

Figure 5:
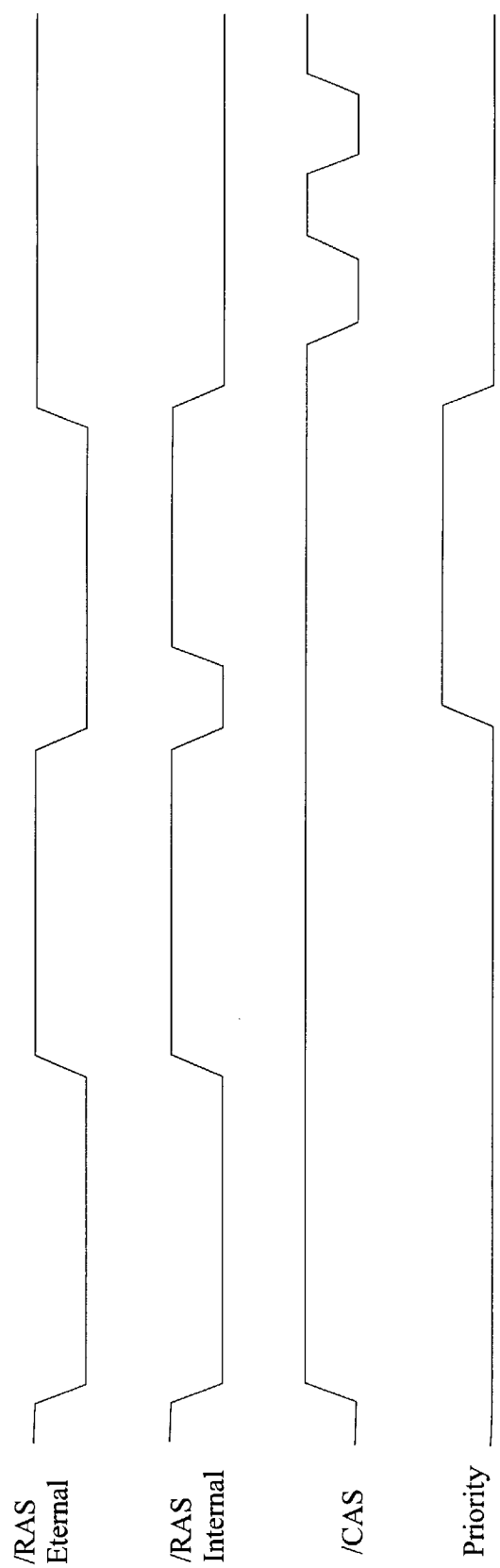
FIG. 5 is a conceptual timing diagram depicting an exemplary priority operation of the memory depicted in FIG. 2.

An exemplary priority access cycle is depicted in FIG. 5. During normal accesses, such as those described above, an internally generated /RAS signal closely tracks the externally generated /RAS signal and implements the same timing and control functions of a convention /RAS signal. Precharge of the arrays 202 is performed by conventional precharge circuitry 210 during the period when /RAS external is high (at the same time, the mode of any dynamic circuitry constructing memory 200 are set to the appropriate voltages). The internal generated /RAS signal is preferably generated within the clock generators of circuitry 208.

When a priority access is required, an active (logic high) PRIORITY signal is asserted. In response to the assertion of the active PRIORITY signal, the internally generated /RAS transitions high, sending memory 200 into a precharge cycle, notwithstanding the state in which externally generated /RAS is currently in. Any memory access operations currently being performed, are terminated as memory 200 enters the priority precharge. The arrays 202 are precharged by precharge circuitry 210 and the dynamic circuits set to the appropriate voltages.

When PRIORITY transitions low, internal /RAS transitions low, and memory 200 is in an active state. The CPU and/or core logic can then perform a memory operation on a priority basis. For example, a memory access can be performed as was done in FIGS. 3 and 4 above. For illustration purposes, selected /CAS cycles (preferably externally generated) for timing the output of memory 200 are shown in FIG. 5. This allows the CPU and/or the core logic to perform operations on a more efficient data or meet the immediate needs of the CPU.

The priority memory operation does not have to be an access (read or write). For example, a command operation or a refresh operation, as known in the art, could be performed on a priority basis, as required.

The priority active cycle continues as long as internally generated /RAS remains low. Unless PRIORITY is reasserted, memory 200 returns to operations timed by external /RAS with the next logic high cycle of external /RAS.

FIGS. 6A and 6B provide a side by side comparison of the pin assignments of a conventional synchronous DRAM in a 50-pin TSOP II package (FIG. 6A) and a synchronous DRAM in a 50-pin TSOP II package embodying the principles of the present invention. It should be noted that memories according to the principles of the present invention may be packaged in any one of a number of different available packages, the 50-pin TSOP II package depicted for exemplary purposes only.

Memories embodying the principles of the present invention have substantial advantages over the prior art. Among other things, inputting at least some addresses during precharge reduces the latency to a random access. Address pipelining also allows for multiple random accesses during a single /RAS cycle, the number variable as a function of the number of banks provided. Further, pipelined addressing and consequently pipelined data accesses, correspond better to the manner in which most CPUs are designed to handle data flow. Finally, the priority provisions of the present invention allow the CPU to interrupt current memory operations, if any, and gain control of the memory to perform a priority operation.

Although the present invention and its advantages have been described in detail, it should be understood that various changes, substitutions and alterations can be made herein without departing from the spirit and scope of the invention as defined by the appended claims.

What is claimed is:

1. A memory comprising:

an array of dynamic random access memory cells;

addressing circuitry for selectively accessing ones of said memory cells in response to received addresses; and priority access control circuitry operable to:

in a first mode precharge said array during a precharge state of an external row address strobe and initiate accesses to said array during an active state of said external row address strobe; and in a second mode precharge said array during a precharge state of an internal row address strobe initiated by a priority access signal received during any one of said precharge and active states of said external row address strobe and initiate accesses to said array during an active state of said internal row strobe initiated by said priority access signal, said access control circuitry returning to said first mode on a subsequent precharge state of said external row address strobe.

2. The memory of claim 1 and further comprising pipelining circuitry for pipelining received addresses to said addressing circuitry.

3. The memory of claim 1 wherein said memory comprises multiple arrays of dynamic random access memory cells.

4. The memory of claim 1 wherein said addressing circuitry comprises dynamic circuitry, nodes of said dynamic circuitry set to a predetermined voltage during precharge in said priority mode.

5. A method of operating a memory including an array of dynamic random access memory cells operating in precharge and active cycles comprising the steps of:

in a first mode, timing the precharge and active cycles with an externally generated row address strobe;

in a priority mode, timing the precharge and active cycles with an internally generated row address strobe; comprising the substeps of:

initiating the active cycle of the internally generated row address strobe by a first change in state of a received priority address signal asserted during any one of the precharge and active cycles of the externally generated row address strobe; and initiating the precharge cycle of the internally generated row address strobe by a second change in state of the priority address signal; and returning from the priority mode to the first mode in response to the start of a subsequent active cycle of the externally generated row address strobe.

6. The method of claim 5 wherein said step of timing the precharge and active cycles with an internally generated row address strobe comprises the substep of generating the row address strobe independent of the externally generated row address strobe.

7. The method of claim 5 wherein memory operations ongoing in the first mode are terminated upon initiation of the priority mode.

* * * * *